United States Patent [19]

LaRosa et al.

[11] Patent Number: 5,784,419
[45] Date of Patent: Jul. 21, 1998

[54] EFFICIENT DIGITAL FILTER AND METHOD USING COEFFICIENT PRECOMBING

[75] Inventors: Christopher P. LaRosa, Lake Zurich; Tracie A. Schirtzinger, Libertyville, both of Ill.

[73] Assignee: Motorola, Inc., Schaumburg, Ill.

[21] Appl. No.: 726,018

[22] Filed: Oct. 4, 1996

[51] Int. Cl.[6] ............................................. H04B 1/10
[52] U.S. Cl. ................................. 378/350; 364/724.19
[58] Field of Search .............................. 332/103; 375/200, 375/308, 350, 355; 364/724.011, 724.03, 724.06, 724.08, 724.12, 724.16

[56] References Cited

U.S. PATENT DOCUMENTS

| | | | |
|---|---|---|---|
| 3,872,290 | 3/1975 | Crooke et al. | 364/724.12 |
| 5,157,693 | 10/1992 | Lemersal, Jr. et al. | 375/67 |
| 5,353,026 | 10/1994 | Wilson | 341/143 |
| 5,487,089 | 1/1996 | Misaizu et al. | 375/350 |
| 5,508,741 | 4/1996 | Hieda | 348/252 |
| 5,513,223 | 4/1996 | Shoji | 375/350 |
| 5,515,402 | 5/1996 | Chester | 375/350 |
| 5,535,150 | 7/1996 | Chiang | 364/724.19 |
| 5,648,922 | 7/1997 | Han | 364/724.1 |

OTHER PUBLICATIONS

TIA/EIA Interim Standard, "Mobile Station–Base Station Compatibility Standard for Dual–Mode Wideband Spread Spectrum Cellular System", TIA/EIA/IS–95, pp. 6–27 to 6–28, Jul. 1993.

Kobayashi et al., "An Integrated π/4–Shift QPSK Baseband Modulator", *IEEE 1994 Custom Integrated Circuits Conference*, pp. 399–402, 1994.

*Primary Examiner*—Stephen Chin
*Assistant Examiner*—Joseph Roundtree
*Attorney, Agent, or Firm*—John G. Rauch

[57] ABSTRACT

A digital filter (200) suitable for use in a CDMA or other burst-mode communication device (100) employs precombining of filter coefficients to reduce filter complexity and power dissipation. The digital filter (200) includes a coefficient storage circuit (216) for storing the precombined coefficients, a selection circuit (212) for selecting appropriate precombined coefficients in response to the input signal and a combining circuit (214) for combining the appropriate precombined coefficients to produce a filtered signal.

19 Claims, 4 Drawing Sheets

TABLE 1. FILTER MULTIPLEXING LOGIC

| INPUT CHIP PAIR | | SELECTED OUTPUT $y_i(\ell)$ | |
|---|---|---|---|
| $b_{2i}$ | $b_{2i+1}$ | OPTION "A" | OPTION "B" |
| 0 | 0 | 0 | 0 |
| +1 | 0 | $h(\ell+8i)$ | 0 if $i<3$<br>$h(\ell+8i)+h(\ell+8i+4)$ if $i>3$ |
| −1 | 0 | $-h(\ell+8i)$ | 0 if $i<3$<br>$-h(\ell+8i)-h(\ell+8i+4)$ if $i>3$ |
| 0 | +1 | $h(\ell+8i+4)$ | $h(\ell+8i)+h(\ell+8i+4)$ if $i<3$<br>0 if $i>3$ |
| 0 | −1 | $-h(\ell+8i+4)$ | $-h(\ell+8i)-h(\ell+8i+4)$ if $i<3$<br>0 if $i>3$ |
| +1 | +1 | $h(\ell+8i)+h(\ell+8i+4)$ | $h(\ell+8i)+h(\ell+8i+4)$ |
| +1 | −1 | $h(\ell+8i)-h(\ell+8i+4)$ | $h(\ell+8i)-h(\ell+8i+4)$ |
| −1 | +1 | $-h(\ell+8i)+h(\ell+8i+4)$ | $-h(\ell+8i)+h(\ell+8i+4)$ |
| −1 | −1 | $-h(\ell+8i)-h(\ell+8i+4)$ | $-h(\ell+8i)-h(\ell+8i+4)$ |

NOTES: $i=0,1,\ldots,5$ DENOTES THE CHIP-PAIR NUMBER
$\ell=0,1,2,3$ DENOTES THE SAMPLE NUMBER DURING THE CHIP INTERVAL
THE FILTER OUTPUT IS GIVEN BY $y(\ell)=y_0(\ell)+y_1(\ell)+y_2(\ell)+y_3(\ell)+y_4(\ell)+y_5(\ell)$

EFFICIENT DIGITAL FILTER AND METHOD USING COEFFICIENT PRECOMBING

FIELD OF THE INVENTION

The present invention relates generally to communication devices. The present invention relates more particularly to a digital filter for use in communication devices.

BACKGROUND OF THE INVENTION

In present day communication devices, digital filters are favored for their ease of implementation, efficient operation and good performance. Such filters can be built using off the shelf components such as digital signal processors (DSPs), custom designed using digital logic elements or implemented using read only memory (ROM) based table look-up techniques. Many functions may be implemented using such digital filters.

One particular application for digital filters is in a communication device such as a radiotelephone handset. Filters are used for filtering received and transmitted signals at the radiotelephone. A radiotelephone handset is used in communication systems such as cellular telephone systems for radio communication with one or more fixed base stations. Communication is according to a predefined protocol, for example, time division multiple access (TDMA) or code division multiple access (CDMA).

A radiotelephone handset operating according to EIA/TIA standard IS-95 for CDMA communication must perform a baseband filtering operation on the transmitted in-phase and quadrature-phase chip sequences in order to limit both transmit splatter and intersymbol interference. This standard requires that the measured, sampled impulse response match the specified filter coefficients (48 non-zero values) with a mean squared error of no greater than 3%. In addition, the measured frequency response must fall within the limits specified by the standard. These limits include having at least 40 dB of stopband attenuation and no more than 3 dB of passband ripple. The filter uses a clock rate of 4.9152 MHz; the coefficients are spaced one-quarter of a chip time (0.20345 μsec) apart. The resulting memory length of the filter is twelve chip intervals.

Previous attempts at developing a digital filter which provides this performance have yielded solutions which are unacceptable in both gate count and power consumption. Gate count refers to the number of logic gates used in the filter and is a measure of the silicon area required by a design in an integrated circuit. Similar designs using fewer gates are less expensive to produce. Power consumption is also proportional to the number of gates. In a consumer product such as a radiotelephone handset, minimizing product cost and power consumption, and thereby maximizing battery-powered talk time and standby time, are of paramount importance.

In one implementation, using a general-purpose DSP which has a multiply-accumulate function, implementation of this filter requires a total of 24 multiply-accumulate functions every clock cycle. At the filter clock rate of 4.9152 MHz, this DSP requires 118 MIPS (million instructions per second). Such a performance level is unattainable at reasonable cost and power dissipation levels in a radiotelephone handset.

Another implementation uses a ROM (read only memory) based look-up table approach which maps the 12-chip input sequence into an 8 bit output word. Since, according to the IS-95 standard, each input chip can have three values (+1, −1 and 0) the resulting ROM size is $3^{12}$ (531,441) words by 8 bits. The size of such a ROM is greater than 300,000 equivalent gates, and is too large for implementation in a radiotelephone handset.

Accordingly, there is a need for a digital filter which can implement the described filter with reduced gate count and power dissipation levels.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

DETAILED DESCRIPTION OF A PREFERRED EMBODIMENT

Figure 1:
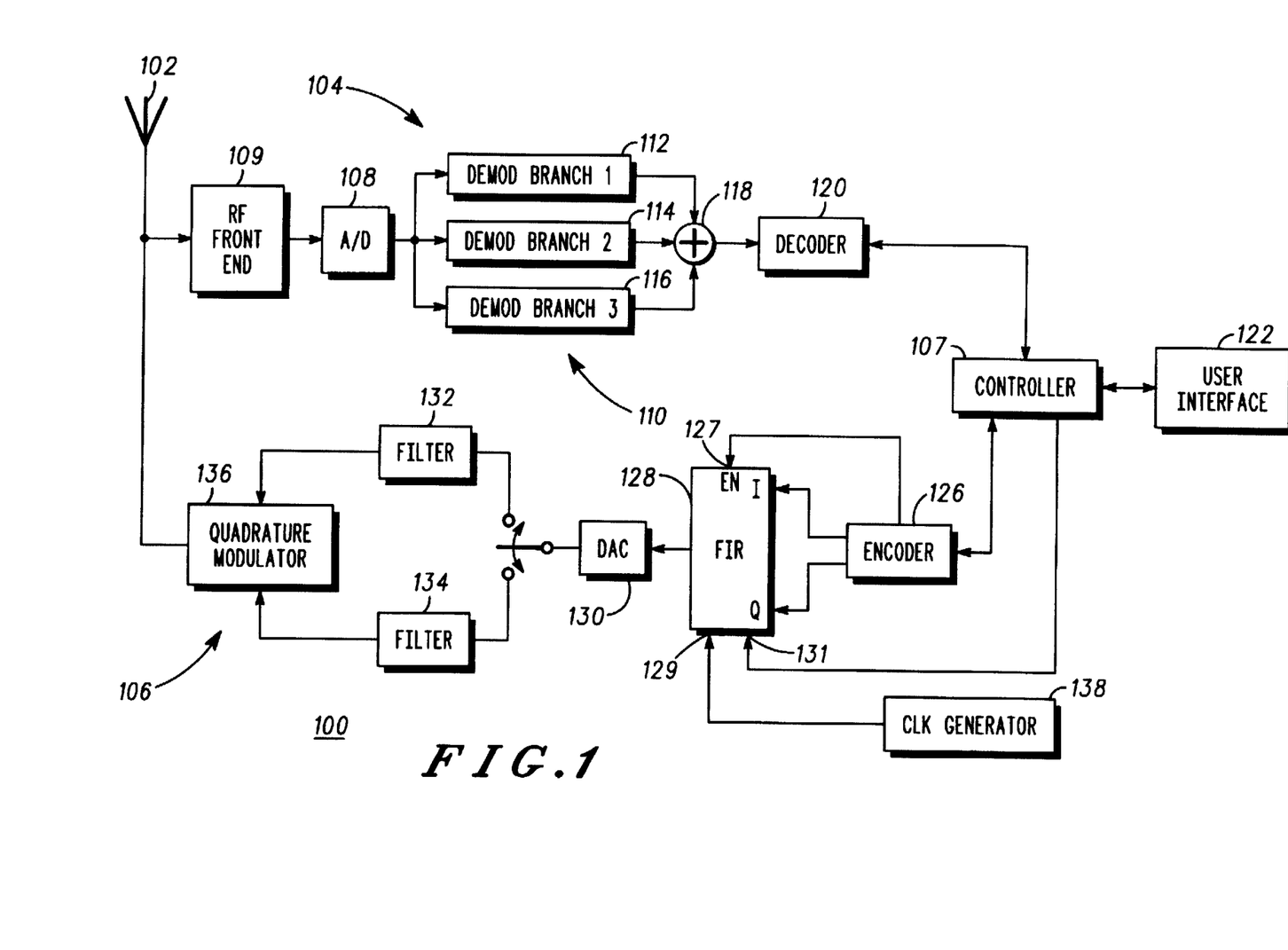
FIG. 1 is an operational block diagram of a communication device.

Referring now to FIG. 1, it shows an operational block diagram of a communication device 100. The communication device 100 may be operable in any suitable system but will be described particularly as operating in association with a CDMA communication system according to EIA/TIA interim standard IS-95. In such a system, the communication device 100 is implemented as a mobile station or radiotelephone handset configured for radio frequency (RF) communication with one or more remote base stations. Communication is according to the IS-95 protocol. The communication device 100 includes an antenna 102, a receiver section 104, a transmitter section 106, a controller 107 and a user interface 122.

The receiver section 104 includes a radio frequency front end 109, an analog to digital converter 108, a rake receiver 110, and a decoder 120. The rake receiver 110 includes a first demodulator branch 112, a second demodulator branch 114, a third demodulator branch 116 and a combiner 118. The antenna 102 sends and receives RF signals to and from a base station (not shown). RF signals received at the antenna 102 are filtered and frequency translated (down-converted) to intermediate frequency (IF) signals by the RF front end 109. The IF signals are converted from analog signals to digital data and otherwise processed in analog to digital converter 108.

In the rake receiver 110, output symbols from each demodulator branch or finger of the rake receiver are combined by the combiner 118, which forms a received signal. The combiner 118 provides the received signal to the decoder 120. The decoder 120 may be a Viterbi decoder or another type of convolutional decoder or any other suitable decoder. The decoder 120 recovers the data transmitted on the RF signals and outputs the data to the controller 107.

The controller 107 formats the data into recognizable voice or information for use by user interface 122. The controller 107 is electrically coupled to other elements of the communication device 100 for receiving control information and providing control signals. The control connections are not shown in FIG. 1 so as to not unduly complicate the drawing figure. The controller 107 typically includes a microprocessor and memory. The user interface 122 communicates the received information or voice to a user. Typically, the user interface 122 includes a display, a keypad, a speaker and a microphone.

Upon transmission of radio frequency signals from the communication device 100 to a remote base station, the user interface 122 transmits user input data to the controller 107. The controller 107 formats transmit information obtained from the user interface 122 and conveys it to the transmitter section 106 for conversion into modulated RF signals.

The transmitter section 106 includes an encoder 126, a finite impulse response (FIR) digital filter 128, a digital to analog converter or DAC, 130, a first analog filter 132, a second analog filter 134, a quadrature modulator 136 and a clock generator 138. The encoder 126 encodes transmit information received from the controller, including separating the information into in-phase data and quadrature-phase data, and provides the transmit information to the digital filter 128. In the preferred embodiment, the transmit information comprises an input chip sequence corresponding to the in-phase data and an input chip sequence corresponding to the quadrature-phase data. The input chip sequences consist of chips or samples which take on values designated +1 and −1.

The encoder 126 provides an enable signal to an enable input 127 of the digital filter 128 to control operation of the digital filter 128. In the preferred embodiment, the enable signal comprises a sequence of enable signal values. Each enable signal value corresponds to an in-phase chip and a quadrature-phase chip. When the enable signal has a first value, such as logic 1, the digital filter 128 operates to filter the input chip sequences. When the enable signal has a second value, such as logic −1, the digital filter 128 assigns zero values to the in-phase and quadrature-phase input chips prior to filtering these sequences. The digital filter 128 filters the transmit information received from the encoder as an input signal in a manner to be described below, and provides the result to DAC 130 as a filtered signal.

The clock generator 138 provides clock signals to a filter clock input 129 of the digital filter 128. These clock signals include a chip clock, which is preferably 1.2288 MHz, and a filter clock for the digital filter 128. In the preferred embodiment, the filter clock is provided at a multiple of the chip clock, such as four times or eight times the chip clock rate.

The controller 107 provides a sample number or index 1 to an input 131 of the digital filter 128. The input chip sequences are preferably oversampled by a factor of N, with N being preferably 4. That is, each input chip is sampled N times. The sample number 1 indicates which of the N samples is being provided to the digital filter 128.

The DAC 130 converts the filtered signal from digital form to analog form and provides analog filtered signals to the first analog filter 132 and the second analog filter 134. The DAC 130 provides in-phase analog information to the first analog filter 132 and quadrature-phase analog information to the second analog filter 134. After analog filtering, the in-phase and quadrature-phase signals are provided to the quadrature modulator for modulation, power amplification and up-conversion to appropriate RF signal frequencies. The RF signals are conveyed to the antenna 102 and transmitted.

Figure 2:
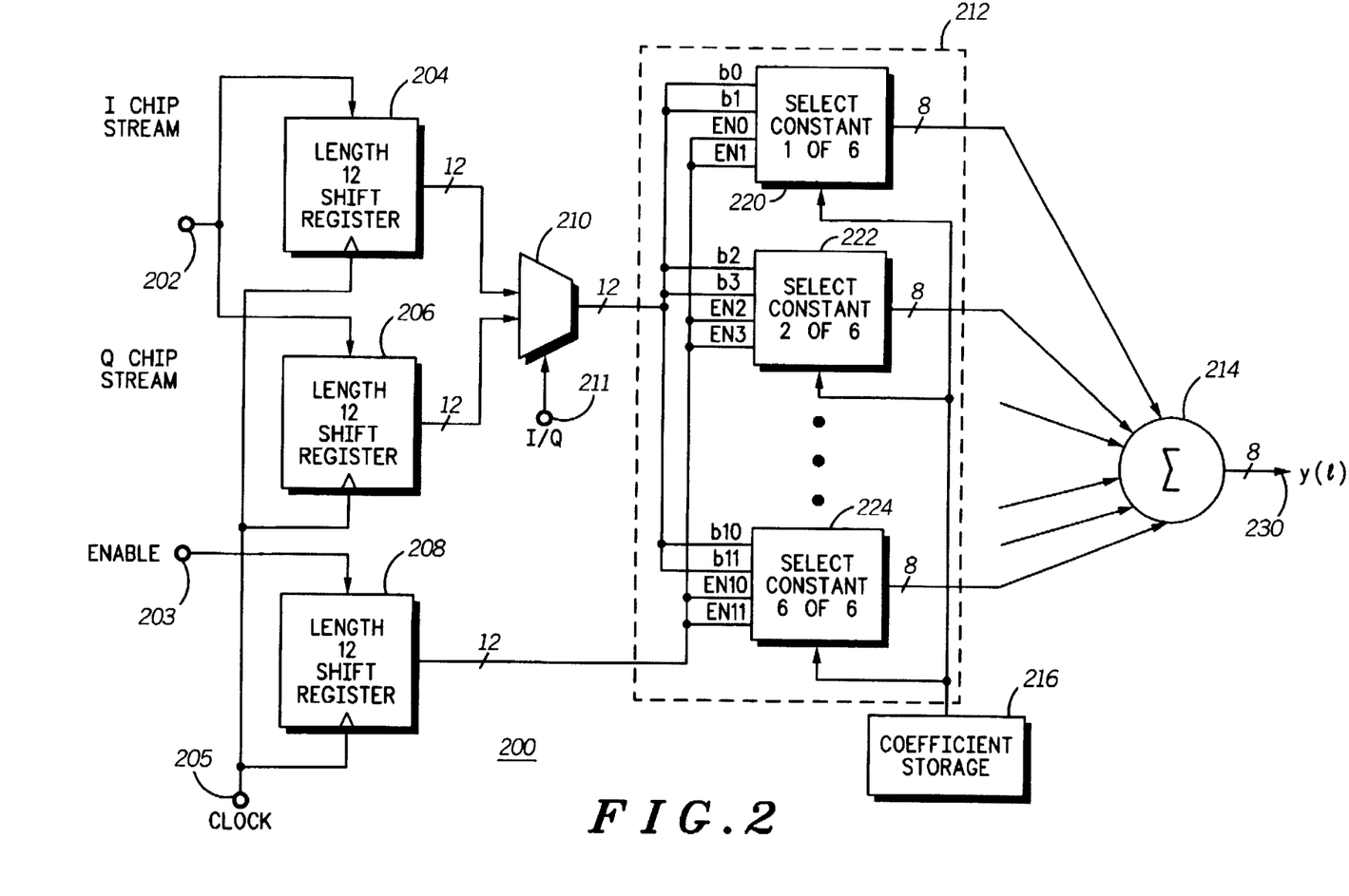
FIG. 2 is an operational block diagram of a finite impulse response digital filter for use in the communication device of FIG. 1.

FIG. 2 is a block diagram of a digital filter 200 for use with the communication device 100 of FIG. 1. The digital filter 200 is configured for filtering an input signal and producing a filtered signal. The digital filter 200 includes an input 202 for receiving the input signal, an enable input 203 for receiving an enable signal, and a clock input 205. The digital filter 200 further includes a first shift 204, a second shift register 206, a third shift register 208, a multiplexer 210, a selection circuit 212, a combining circuit 214 and a coefficient storage circuit 216. In the preferred embodiment, the input signal received at the input 202 is an input stream including in-phase input samples or chips and quadrature-phase input samples or chips.

Described mathematically, the digital filter 200 implements the following equation:

$$y(i) = \sum_{k=0}^{47} b(i-k) \times h(k) \quad (1)$$

Here, b(i) is the input chip sequence, h(k) is the k-th filter coefficient and y(i) is the filter output sequence. The k filter coefficients are 48 predefined non-zero values with one-quarter chip tap spacing as specified by the IS-95 specification.

Figure 3:
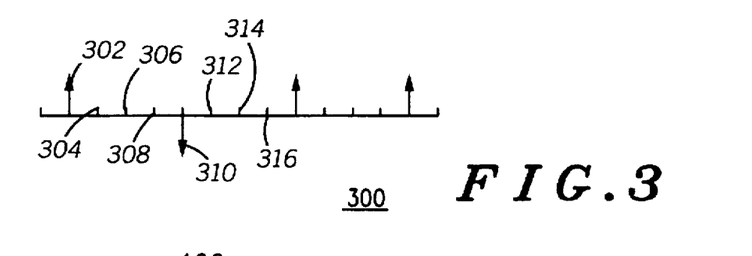
FIG. 3 is an exemplary input chip sequence to the finite impulse response digital filter of FIG. 2.

FIG. 3 illustrates an exemplary input chip sequence 300 to the digital filter 200. The input chip sequence, b(i), can take on values of +1, −1 or 0. The chip rate is 1.2288 MHz. Because the tap spacing is one-quarter of the chip duration, the input chip sequence is oversampled by a factor of N=4, meaning that each of the input chips includes a valued input sample and N−1=3 zero-valued samples. Valued input samples can have one of a predetermined number of values, specifically one of the values +1, −1 or 0. Thus, in FIG. 3, the input chip sequence 300 includes a first valued sample 302 followed by three zero-valued samples, sample 304, sample 306 and sample 308. The input chip sequence 300 further includes a second valued sample 310 followed by three zero valued samples, sample 312, sample 314 and sample 316. The filter as implemented in the communication device 100 (FIG. 1) receives two such input chip sequences, one for in-phase data and one for quadrature-phase data.

A brute-force implementation of the filter defined by equation (1) above would require 48 multipliers plus a 48-input adder for both the in-phase (I) and quadrature-phase (Q) channels. In accordance with the present invention, in order to reduce the complexity of the filter and to reduce its component cost and power dissipation, design simplifications have been made to implement this filter.

First, much of the filter hardware is time-shared between the I and Q channels. This reduces the number of logic gates required to implement the filter and the associated power dissipation at the expense of having to run the filter at twice the clock rate, or eight times the chip rate, or 9.8304 MHz.

Second, because the input chip sequence b(i) can only take on values of +1, −1 and 0, the filter coefficients are either summed, negated and summed, or set to zero. As a result, logic gates used to form multipliers are eliminated from the filter according to the present invention.

Third, because the input sequence is oversampled by a factor of four, there will only be twelve non-zero terms at each sampling instant. For each new input chip, $b_i$, four output samples will be generated:

$$y(l) = \sum_{i=0}^{11} b_i \times h(l + 4i) \qquad (2)$$

where l=0, 1, 2, 3 ... represents the sample number during the chip interval. As a result, a 12-input adder is required in place of a 48-input adder.

Lastly, according to the present invention, pairs of input coefficients are precombined. Precombining allows an adder to be replaced by a multiplexer and some simple, combinatorial logic. As an example, consider the output due to the first two non-zero inputs. The output, $y_o$, will be a constant value which is either the sum, difference, negated sum, or negated difference of the two filter coefficients:

$$\begin{aligned}
y_0 &= b_0 h(0) + b_1 h(4) & (3) \\
&= h(0) + h(4) & \text{if } b_0, b_1 = +1, +1 \\
&= h(0) - h(4) & \text{if } b_0, b_1 = +1, -1 \\
&= -[h(0) + h(4)] & \text{if } b_0, b_1 = -1, -1 \\
&= -[h(0) - h(4)] & \text{if } b_0, b_1 = -1, +1
\end{aligned}$$

Similar simplifications are made for the other outputs. The precombined coefficients may be stored in a memory or established as hardwired connections to appropriate logic levels, further reducing the required number of gates. As a result of these simplifications, the 12-input adder for summing the y(l) samples can be replaced by a 6-input adder plus some multiplexing logic. Precombining the coefficients in this manner leads to a reduction in the number of gates and requisite silicon area because a multiplexer with constant inputs requires fewer gates than a full adder.

Referring again to FIG. 2, the first shift register 204 is coupled to the input 202 to receive in-phase input samples, forming an in-phase sample storage circuit for storing in-phase input samples. Similarly, the second shift register 206 is coupled to the input to receive quadrature-phase input samples, forming a quadrature-phase sample storage circuit for storing quadrature-phase input samples. The third shift register 208 forms an enable signal storage circuit coupled to the enable input 203 for storing enable signal samples. Each shift register is clocked by a clock signal received at the clock input 205. There is thus a time correspondence between the enable signal samples stored in the third shift register 208 and the in-phase input samples stored in the first shift register 204 and the quadrature-phase input samples stored in the second shift register 206.

The multiplexer 210 selectively couples one of the first shift register 204 and the second shift register 206 to the selection circuit 212 in response to a control signal received at an I/Q input 211. The control signal is provided by the controller 107 (FIG. 1) or by any other suitable source. In this manner, the selection circuit 212 and the combining circuit 214 are shared by the in-phase sample storage circuit and the quadrature-phase sample storage circuit for producing the filtered signal. This sharing of hardware between the in-phase and quadrature-phase channels substantially reduces the number of gates and silicon area and the associated current drain required to implement the digital filter 200.

The coefficient storage circuit 216 stores a plurality of precombined coefficients. In the preferred embodiment, the precombined coefficients are formed from filter coefficients defined by the IS-95 CDMA specification. However, the precombined coefficients could be suitably formed from other predefined coefficients in accordance with other filter design requirements. The precombined coefficients are formed from filter coefficients in a manner to be described below. In the preferred embodiment, the coefficient storage circuit 216 is configured for storing the filter coefficients as well as the precombined coefficients. The coefficient storage circuit 216 may store precombined coefficients (and filter coefficients) in any suitable manner, including in a memory device. In the preferred embodiment, the coefficient storage circuit comprises hardwired connections to appropriate logic levels which provide the stored precombined coefficients. Hardwiring coefficients minimizes the number of gates and silicon area required b the coefficient storage circuit 216.

The selection circuit 212 is coupled to the input 202 through the first shift register 204 and the second shift register 206 and the multiplexer 210 and the coefficient storage circuit 216 for selecting appropriate precombined coefficients from the plurality of precombined coefficients in response to the input signal received at the input 202. The input samples are stored as in-phase input samples in the first shift register 204 and as quadrature-phase input samples in the second shift register 206. The selection circuit 212 comprises a plurality of selectors, such as selector 220, selector 222 and selector 224. Each selector has a selector input coupled to the input 202 for receiving one or more input samples. Input values to the selectors are selected from stored input values by the multiplexer 210. Structure and operation of the selectors will be described below in conjunction with FIG. 4. In the preferred embodiment, the selection circuit 212 comprises 6 selectors. As is indicated in FIG. 2, each selector receives as an input two $b_i$ values and two enable values. The selection circuit 212 selects a group or a predetermined number of precombined coefficients from the coefficient storage circuit 216.

Figure 4:
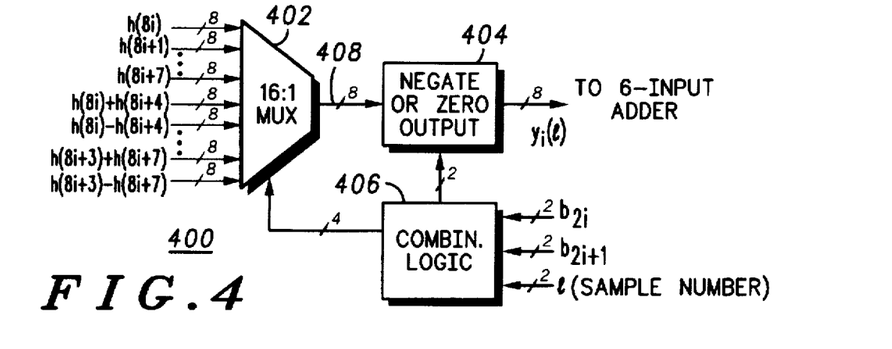
FIG. 4 is an operational block diagram of a selector for use in the finite impulse response digital filter of FIG. 2.

Referring to FIG. 4, a selector 400 includes a multiplexer 402, an operation block 404 and a logic block 406. The logic block 406 receives as an input the one or more input samples provided to the selector 400 from the input. In the preferred embodiment, each input sample $b_2 i$ and $b_{2i+1}$ is a two bit input consisting of the input sample value $b_{2i}$ and the associated enable signal value. The logic block 406 receives input samples $b_{2i}$ and $b_{2i+1}$ and the sample number l. In response to the input samples, the logic block 406 provides a control signal to the multiplexer 402. The logic block 406 may consist of any appropriate circuitry necessary to accomplish this function.

The inputs of the multiplexer 402 are coupled to the coefficient storage circuit 216 (FIG. 2). In response to the control signal, the multiplexer 402 selects a precombined coefficient at one of the inputs as indicated in FIG. 4 and provides the selected precombined coefficient to the output 408 of the multiplexer 402. In the preferred embodiment, the coefficient storage circuit 216 stores filter coefficients as well as precombined coefficients. In such an embodiment, the multiplexer 402 selects a filter coefficient or a precombined coefficient and provides it to the output 408. As noted above, in the preferred embodiment, the precombined coefficients and filter coefficients are hardwired at the inputs of the multiplexer 402.

Also as noted, the input signal is preferably oversampled by a factor of N, so that each of the input samples includes a valued input sample and N−1 zero-valued input samples. N is preferably 4, but may be any other value. In FIG. 4, l is provided to the logic block 406 and serves as an index or sample number for the oversampled values. Thus, the selection circuit 212 including the selector 400 selects the appropriate precombined coefficients in response to the stored input samples received from the first shift register 204 and the second shift register 206 (FIG. 2) and the sample number l. The sample number l is a time reference indicating the affect of the N−1 zero-valued samples.

The operation block 404 is coupled to the multiplexer 402 for selectively negating, zeroing or passing unmodified the precombined coefficient (or filter coefficient) provided at the output 408 of the multiplexer in response to a control signal received at the input 410 of the operation block 404. In the preferred embodiment, each input sample $b_{2i}$ and $b_{2i+1}$, is a two-bit input consisting of one bit for the input sample value $b_i$ or $b_{2+i}$ and one bit for the associated enable signal value. A zero value is provided by the operation block 404 when the enable signal received at the enable input 203 has a predetermined disable value. For each input sample or chip clocked into the first shift register 204 and the second shift register 206, a corresponding enable sample is clocked into the third shift register 208. Thus, the selector provides one of the filter coefficient, the negative of the filter coefficient, the precombined coefficients, the negative of the precombined coefficient and a zero value to the combining circuit. This embodiment and the enable signal are used when the input signal comprises trinary-valued input samples having values of +1, −1 and 0.

In an alternative embodiment, the input signal comprises binary-valued input samples having values of +1 and −1. The operation block provides one of the precombined coefficient and a negative of the precombined coefficient to the combining circuit 214 (FIG. 2). Since the precombined coefficient is either a sum or difference or negated sum or difference of two filter coefficients, providing the operation block 404 reduces the number of values that must be stored in the coefficient storage circuit 216. Only the sums and differences must be stored and negation is done by the operation block 404. The operation block 404 may consist of any circuitry necessary to implement the described function.

Figure 5:
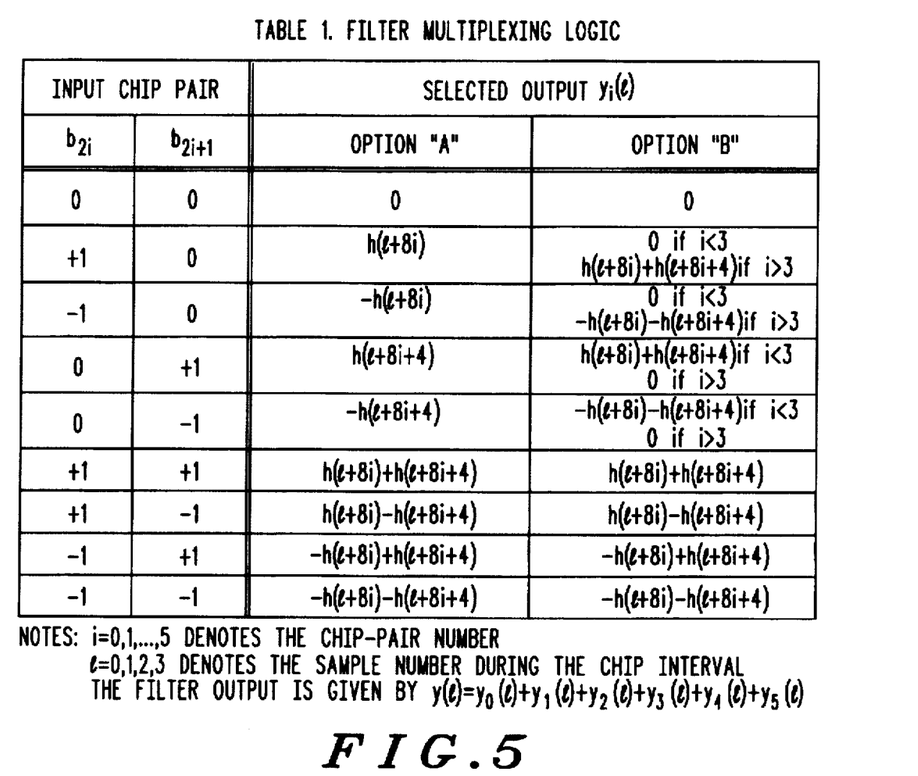
FIG. 5 is a table illustrating filter multiplexing logic for one embodiment of the finite impulse response digital filter of FIG. 2.

FIG. 5 illustrates filter multiplexing logic for two embodiments of the digital filter 200. In the preferred embodiment, described herein as "Option 'A'," the digital filter 200 provides full transmit filter functionality, including proper burst mode performance. During ramp-up and ramp-down of the transmitter section 106 (FIG. 1), a string of zero values will be input to the filter. As a result, it is necessary to output the individual filter coefficients. Thus, in this preferred embodiment, the individual filter coefficients are stored in the coefficient storage circuit 216. The selector provides one of a filter coefficient, a negative of the filter coefficient, a precombined coefficient, a negative of a precombined coefficient and a zero value in response to the input samples. Because operation according to the IS-95 CDMA standard is bursty in nature, this embodiment is preferred for a filter used in a communication device such as communication device 100 operated according to the CDMA standard. The filter multiplexing logic necessary for this embodiment is illustrated in FIG. 5 in the table column labeled "Option 'A'."

In an alternative embodiment, additional size reduction of the digital filter according to the present invention is provided at the cost of degraded burst-mode performance. The filter multiplexing logic necessary for this embodiment is illustrated in FIG. 5 in the table column labeled "Option 'B'." As is shown there, this embodiment utilizes only the sum, difference and zero constants. The individual filter coefficients are not used and therefore need not be stored in the coefficient storage circuit 216.

Figure 6:
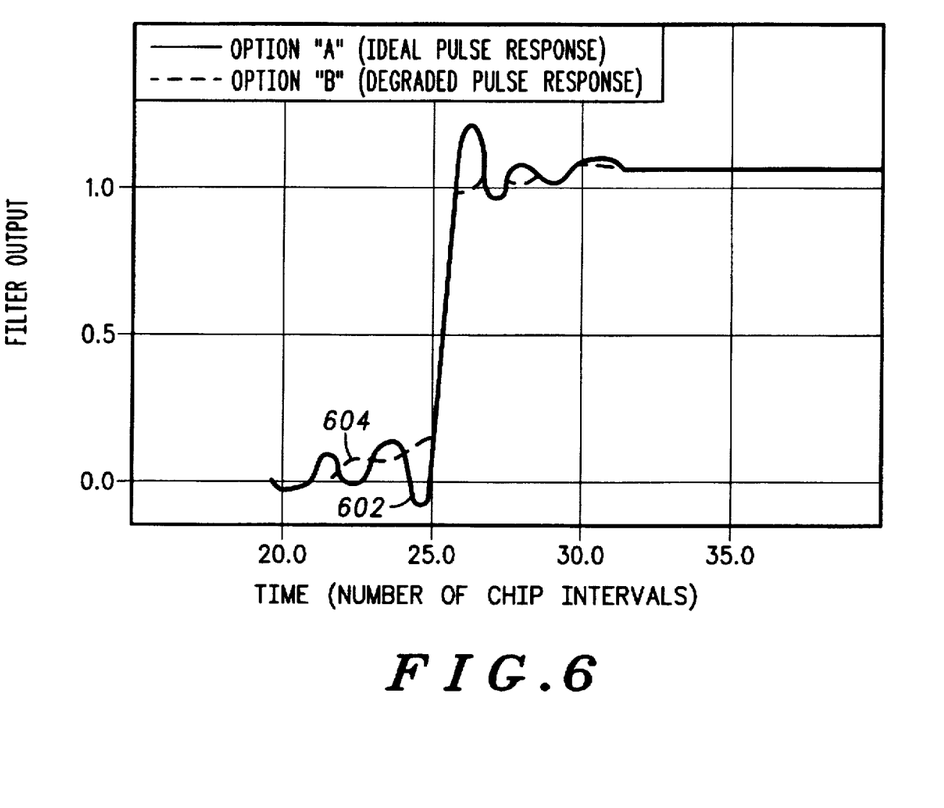
FIG. 6 illustrates the pulse response of two filter embodiments according to the present invention.

Although this embodiment has the same steady state performance as the preferred embodiment Option 'A', the transient response of Option B is slightly degraded relative to the transient response of Option A. FIG. 6 illustrates the pulse response of two filter embodiments according to the present invention. A first pulse response 602 illustrates the ideal pulse response, which is the pulse response provided by the preferred embodiment of the filter according to Option A. A second pulse response 604 illustrates a degraded pulse response provided by the alternative embodiment of the filter according to Option B. The second pulse response 604 exhibits a slight transient error. This transient error is minimized by the multiplexing logic illustrated in the table of FIG. 5 and is reduced by the analog filters 132, 134 which follow the digital filter 128 according to the present invention in a communication device 100 (FIG. 1). This alternative embodiment is appropriate for systems using digital filters which are not time division multiplexed or can tolerate slightly degraded ramp-up and ramp-down performance.

Referring again to FIG. 2, the combination of each multiplexer 402 from each selector 400 together forms a plurality of multiplexers, each multiplexer selecting one precombined coefficient of a predetermined number, such as six precombined coefficients, each multiplexer having an input coupled to a hardwired connection of the coefficient storage circuit 216, and a selector input coupled to the in-phase sample storage circuit and the quadrature-phase sample storage circuit for receiving the stored in-phase input samples and the stored quadrature-phase input samples. The combination of each operation block 404 from each selector 400 forms a plurality of operation blocks, each operation block coupled to a respective multiplexer for selectively negating the one precombined coefficient in response to the stored in-phase input samples and the stored the stored quadrature-phase input samples.

The combining circuit 214 is coupled to the selection circuit 212 for combining the appropriate precombined coefficients to produce a filtered signal at the filter output 230. The combining circuit 214 is preferably a 6-input adder, but may be any circuit suitable for combining a group of precombined coefficients to produced the filtered signal.

As can be seen from the foregoing, the present invention provides a digital filter and method suitable for use in burst-mode communication applications. The digital filter provides substantially reduced gate count and power dissipation levels over prior implementations. These benefits are provided by precombining filter coefficients to eliminate digital adder circuits and to use smaller size adders in conjunction with simple multiplexers. These benefits are further provided by sharing filter hardware between the in-phase and quadrature-phase channels. By capitalizing on aspects of the input data samples, the complexity of the filter circuit is further reduced. For example, because the input chip sequence is limited to values of +1, −1 and 0, multipliers are eliminated in favor of simpler adders and multiplexers. Also, because the input sequence is oversampled by a factor of four, hardware is eliminated from the design to include only non-zero terms of the filter.

While particular embodiments of the present invention have been shown and described, modifications may be made. It is therefore intended in the appended claims to cover all such changes and modifications which fall within the true spirit and scope of the invention.

What is claimed is:

1. A digital filter for filtering an input signal and producing a filtered signal, the digital filter comprising:

an input for receiving the input signal;

a coefficient storage circuit for storing a plurality of precombined coefficients;

a selection circuit coupled to the input and the coefficient storage circuit for selecting appropriate precombined coefficients from the plurality of precombined coefficients in response to the input signal; and a combining circuit coupled to the selection circuit for combining the appropriate precombined coefficients to produce the filtered signal.

2. A digital filter as recited in claim 1 wherein the input signal includes input samples having one value of a predetermined number of values and wherein the selection circuit comprises a plurality of selectors, each selector having a selector input coupled to the input for receiving one or more input samples, each selector including a multiplexer which selects a precombined coefficient in response to the one or more input samples.

3. A digital filter as recited in claim 2 wherein the input signal comprises binary-valued input samples.

4. A digital filter as recited in claim 2 wherein each selector further comprises an operation block coupled to the multiplexer for selectively negating the precombined coefficient in response to the one or more input samples, the operation block providing one of the precombined coefficient and a negative of the precombined coefficient to the combining circuit.

5. A digital filter as recited in claim 4 wherein the input signal is oversampled by a factor of N, each of the input samples including a valued input sample and N–1 zero-valued samples, and wherein the digital filter further comprises an input sample storage circuit for storing only valued input samples as stored input samples, and wherein the selection circuit selects the appropriate precombined coefficients in response to the stored input samples and a time reference indicating an affect of the N–1 zero valued samples.

6. A digital filter as recited in claim 4 wherein the digital filter further comprises an enable input for receiving an enable signal, and wherein each selector further includes an enable input for receiving the enable signal, the operation block providing one of the precombined coefficient, the negative of the precombined coefficient and a zero value to the combining circuit.

7. A digital filter as recited in claim 6 wherein the input signal is oversampled by a factor of N, each of the input samples including a valued input sample and N–1 zero-valued samples, and wherein the digital filter further comprises an input sample storage circuit for storing only valued input samples as stored input samples, and wherein the selection circuit selects the appropriate precombined coefficients in response to the stored input samples and a time reference indicating an affect of the N–1 zero-valued samples.

8. A digital filter as recited in claim 6 wherein the coefficient storage circuit is configured for storing filter coefficients, the plurality of precombined coefficients being formed from the filter coefficients, and wherein each selector provides one of a filter coefficient, a negative of the filter coefficient, a precombined coefficient, a negative of a precombined coefficient and a zero value in response to the one or more input samples.

9. A digital filter as recited in claim 8 wherein the input signal is oversampled by a factor of N, each of the input samples including a valued input sample and N–1 zero-valued samples, and wherein the digital filter further comprises an input sample storage circuit for storing only valued input samples as stored input samples, and wherein the selection circuit selector provides the one of the filter coefficient, the negative of the filter coefficient, the precombined coefficient, the negative of the precombined coefficient and the zero value in response to the stored input samples and a time reference indicating an affect of the N–1 zero-valued samples.

10. A digital filter as recited in claim 1 wherein the input signal includes in-phase input samples and quadrature-phase input samples and wherein the digital filter further comprises:
an in-phase sample storage circuit coupled between the input and the selection circuit for storing in-phase input samples; and
a quadrature-phase sample storage circuit coupled between the input and the selection circuit for storing quadrature phase input samples.

11. A digital filter as recited in claim 10 wherein the selection circuit and the combining circuit are shared by the in-phase sample storage circuit and the quadrature-phase sample storage circuit for producing the filtered signal.

12. A digital filter as recited in claim 1 wherein the coefficient storage circuit comprises hardwired connections to appropriate logic levels.

13. A digital filter for filtering an input signal in response to predetermined filter coefficients and producing a filtered signal, the digital filter comprising:
an input for receiving the input signal, the input signal including in-phase input samples and quadrature phase input samples;
an enable input for receiving an enable signal;
an in-phase sample storage circuit for storing in-phase input samples;
a quadrature-phase sample storage circuit for storing in-phase input samples;
an enable signal storage circuit coupled to the enable input for storing enable signal samples;
a coefficient storage circuit for storing precombined coefficients, the precombined coefficients being formed from the predetermined filter coefficients;
a selection circuit coupled to the in-phase sample storage circuit, the quadrature-phase sample storage circuit, the enable signal storage circuit and the coefficient storage circuit, the selection circuit selecting a predetermined number of precombined coefficients from the coefficient storage circuit in response to stored in-phase input samples and stored quadrature-phase input samples and providing the predetermined number of precombined coefficients as an output, the selection circuit providing a zero value in place of selected ones of the output in response to stored enable signal samples; and
a combining circuit coupled to the selection circuit for combining the predetermined number of precombined coefficients to produce the filtered signal.

14. A digital filter as recited in claim 13 wherein the coefficient storage circuit further stores the predetermined filter coefficients and wherein the selection circuit selects from the precombined coefficients and from the predetermined filter coefficients.

15. A digital filter as recited in claim 13 wherein the coefficient storage circuit comprises hardwired connections to appropriate logic levels and wherein the selection circuit comprises:
a plurality of multiplexers, each multiplexer selecting one precombined coefficient of the predetermined number of precombined coefficients, each multiplexer having an input coupled to a hardwired connection of the coefficient storage circuit for receiving one or more precombined coefficients and a selector input coupled to the in-phase sample storage circuit and the quadrature-phase sample storage circuit for receiving stored in-phase input samples and stored quadrature-phase input samples; and a plurality of operation blocks, each operation block coupled to a respective multiplexer for selectively negating the one precombined coefficient in response to stored in-phase input samples and stored quadrature-phase input samples.

16. A digital filter as recited in claim 15 wherein the coefficient storage circuit further stores the predetermined filter coefficients and wherein the selection circuit selects from the precombined coefficients and from the predetermined filter coefficients.

17. A digital filter as recited in claim 16 wherein the input signal is oversampled by a factor of N, each of the input samples including a valued input sample followed by N−1 zero-valued samples, the coefficient storage circuit storing only valued input samples as stored input samples, and wherein the selection circuit selects the appropriate precombined coefficients in response to the stored input samples and a time reference indicating an affect of the N−1 zero-valued samples.

18. A method of filtering a digital signal according to predetermined filter coefficients, the method comprising the steps of:

storing precombined coefficients, the precombined coefficients being formed from the predetermined filter coefficients;

receiving an input stream corresponding to the digital signal;

selecting a group of precombined coefficients in response to the input stream; and combining the group of precombined coefficients to produce a filtered signal.

19. A method of filtering a digital signal as recited in claim 18 wherein the step of receiving an input stream includes receiving a sequence of input data samples and wherein the method further comprises the steps of:

storing the predetermined filter coefficients;

receiving a sequence of input enable samples, each of the input enable samples corresponding to an input data sample; wherein the selecting step comprises the steps of, when an input enable sample has a value corresponding to a first value, providing one of a precombined coefficient and a predefined filter coefficient; and when the input enable sample corresponds to a second value, providing a zero value.

* * * * *

UNITED STATES PATENT AND TRADEMARK OFFICE
CERTIFICATE OF CORRECTION

PATENT NO. : 5,784,419
DATED : July 21, 1998
INVENTOR(S) : LaRosa et al.

It is certified that error appears in the above-indentified patent and that said Letters Patent is hereby corrected as shown below:

<u>Title Page</u> and column 1, line 2

Item [54] Title
Please replace "PRECOMBING" with --PRECOMBINING--.

Signed and Sealed this

Twentieth Day of October, 1998

*Attest:*

BRUCE LEHMAN

*Attesting Officer*        *Commissioner of Patents and Trademarks*